United States Patent
Hersman et al.

(10) Patent No.: US 12,023,644 B2
(45) Date of Patent: Jul. 2, 2024

(54) APPARATUS, SYSTEM, AND METHODS FOR HIGH-POWER POLARIZATION OF NOBLE GAS NUCLEI

(71) Applicant: Xemed LLC, Durham, NH (US)

(72) Inventors: F. William Hersman, Durham, NH (US); Iulian C. Ruset, Exeter, NH (US)

(73) Assignee: XEMED LLC, Durham, NH (US)

( * ) Notice: Subject to any disclaimer, the term of this patent is extended or adjusted under 35 U.S.C. 154(b) by 1043 days.

(21) Appl. No.: 16/895,721

(22) Filed: Jun. 8, 2020

(65) Prior Publication Data

US 2020/0384437 A1    Dec. 10, 2020

Related U.S. Application Data

(60) Provisional application No. 62/858,582, filed on Jun. 7, 2019.

(51) Int. Cl.
| | |
|---|---|
| *B01J 19/12* | (2006.01) |
| *C01B 23/00* | (2006.01) |
| *G01R 33/28* | (2006.01) |
| *G01R 33/56* | (2006.01) |

(52) U.S. Cl.
CPC .............. *B01J 19/121* (2013.01); *C01B 23/00* (2013.01); *G01R 33/282* (2013.01); *G01R 33/5601* (2013.01); *B01J 2219/0871* (2013.01); *B01J 2219/0875* (2013.01); *B01J 2219/12* (2013.01)

(58) Field of Classification Search
None
See application file for complete search history.

(56) References Cited

U.S. PATENT DOCUMENTS

| | | |
|---|---|---|
| 6,949,169 B2 | 9/2005 | Hersman et al. |
| 7,281,393 B2 | 10/2007 | Hersman et al. |
| 7,719,268 B2 | 5/2010 | Hersman et al. |
| (Continued) | | |

FOREIGN PATENT DOCUMENTS

| | | | |
|---|---|---|---|
| CA | 2416209 A1 | 1/2002 | |
| CA | 2416209 C | * 12/2012 | ........... G01R 33/282 |
| (Continued) | | | |

OTHER PUBLICATIONS

Xeus Technologies LTD, Xeus Polarizer Equipment and Specifications, https://www.xeus-technologies.com/xe-polarizer.

*Primary Examiner* — Andrew Smyth
(74) *Attorney, Agent, or Firm* — Hayes Soloway PC

(57) ABSTRACT

An apparatus, system, and methods for polarizing nuclei of a noble gas are disclosed. The disclosed system may include a polarization apparatus configured to polarize a noble gas mixture including xenon-129. The disclosed system also may include separate volumes for (1) saturating the polarizable noble gas mixture with alkali metal vapor, (2) desaturating said noble gas mixture from its alkali metal vapor after polarization is completed, (3) intermediate storage of the resultant polarized noble gas mixture, and (4) transfer of said polarized noble gas mixture to a storage vessel (e.g., a delivery bag). The disclosed system further may include separate reservoirs for (1) the noble gas(es) to be polarized, (2) lightweight gas(es) to displace the noble gas(es), and (3) a heavy inert gas (e.g., such as natural xenon) to push the polarized noble gas(es) into a storage vessel.

20 Claims, 5 Drawing Sheets

(56) References Cited

U.S. PATENT DOCUMENTS

| | | | |
|---|---|---|---|
| 7,769,068 B2 | 8/2010 | Hersman et al. | |
| 7,928,359 B2 | 4/2011 | Hersman et al. | |
| 8,405,022 B2 | 3/2013 | Hersman et al. | |
| 9,653,869 B1 | 5/2017 | Hersman et al. | |
| 9,673,588 B1 | 6/2017 | Hersman et al. | |
| 9,780,522 B2 | 10/2017 | Hersman et al. | |
| 10,348,057 B2 | 7/2019 | Hersman et al. | |
| 2008/0093543 A1* | 4/2008 | Hersman | G21K 1/16 |
| | | | 250/435 |
| 2014/0216058 A1* | 8/2014 | Tsuboi | H01L 23/38 |
| | | | 62/3.2 |

FOREIGN PATENT DOCUMENTS

| | | | | |
|---|---|---|---|---|
| DE | 60133651 T2 | 6/2009 | | |
| EP | 1303646 A1 | 4/2003 | | |
| EP | 1766309 A2 | 3/2007 | | |
| EP | 2508908 A1 | 10/2012 | | |
| EP | 2067052 B1 * | 5/2016 | | G01R 33/282 |
| EP | 2067052 B1 | 11/2016 | | |
| WO | 0204709 A1 | 1/2002 | | |
| WO | 2005106367 A2 | 11/2005 | | |
| WO | 2008036369 A2 | 3/2008 | | |

* cited by examiner

APPARATUS, SYSTEM, AND METHODS FOR HIGH-POWER POLARIZATION OF NOBLE GAS NUCLEI

CROSS-REFERENCE TO RELATED APPLICATIONS

This patent application claims the benefit of U.S. Provisional Patent Application No. 62/858,582, titled "Apparatus and Method for High-Power Polarization of Noble Gas Nuclei," filed on Jun. 7, 2019, which is herein incorporated by reference in its entirety.

FIELD OF THE DISCLOSURE

The present disclosure relates to spin-exchange optical pumping polarization of noble gas nuclei and, more specifically, to such polarization of xenon-129.

BACKGROUND

Hyperpolarized noble gases, used in conjunction with magnetic resonance imaging (Mill) as a functional pulmonary contrast agent, have been demonstrated in a broad spectrum of diagnostic lung imaging protocols. Specifically, hyperpolarized $^{129}$Xe offers extraordinary potential as a contrast agent for Mill of lung function. $^{129}$Xe is hyperpolarized by spin-exchange optical pumping using a gas mixture of Xe (with a natural abundance of $^{129}$Xe or enriched in the active isotope $^{129}$Xe) that typically also includes a quenching gas, such as nitrogen or hydrogen. The gas mixture acquires a vapor of alkali metal for accomplishing the polarization process. By immersing the polarization chamber volume of the apparatus in a uniform magnetic field and illuminating the mixture with circularly polarized light at the wavelength that is resonant with the D1 alkali transition, the alkali metal vapor becomes polarized. Collisions between the noble gas and alkali atoms transfer the polarization from the alkali valence electrons to the noble gas nuclei.

SUMMARY

The subject matter of this application may involve, in some cases, interrelated products, alternative solutions to a particular problem, and/or a plurality of different uses of a single system or article.

In accordance with some example embodiments, an apparatus configured for polarizing a noble gas is provided. The apparatus includes a body portion having a hollow interior region. The apparatus also includes a laser window disposed at a first end of the body portion and configured to allow laser light to enter the hollow interior region. The apparatus also includes a baseplate disposed at a second end of the body portion, opposite the laser window. The apparatus also includes at least one partition that extends into the hollow interior region and which is aligned substantially parallel with a propagation direction of the laser light. In some cases, the at least one partition includes a plurality of partitions arranged adjacent one another and extending along one transverse direction within the hollow interior region. In some cases, the at least one partition includes: a first plurality of partitions arranged adjacent one another and extending along a first transverse direction within the hollow interior region; and a second plurality of partitions arranged adjacent one another and extending along a second transverse direction within the hollow interior region, wherein the first transverse direction and the second transverse direction differ. In some cases, the apparatus further includes at least one interior region that is at least partially obstructed from illumination by the laser light. In some cases, the at least one partition has at least one passageway defined therein which is configured to have a thermal fluid flowed therethrough. In some cases, the apparatus further includes a glass layer disposed on at least one of: the at least one partition; and the baseplate. In some such instances, the glass material is disposed on each of: the at least one partition; and the baseplate. In some cases, the baseplate has at least one sloped surface having a slope within 5° of horizontal and configured to have the laser light incident therewith. In some such instances, the at least one sloped surface includes a plurality of sloped surfaces having corresponding slopes which converge to an outlet from the apparatus. In some cases, the body portion is configured as a tubular structure having a generally rectangular or square cross-sectional geometry. In some cases, the apparatus further includes a housing at least partially enclosing the body portion. In some such instances: the housing includes at least one of a thermally conductive metal and a thermally conductive alloy; and at least a portion of the housing is in direct physical contact with an exterior surface of the body portion. In some other such instances, the housing has at least one recess defined therein which is configured to receive a heater element therein, wherein the at least one recess is situated proximal an external surface of the body portion. In some other such instances, the housing includes: a first housing portion disposed adjacent a first exterior region of the body portion; and a second housing portion disposed adjacent a second exterior region of the body portion; wherein the first housing portion and the second housing portion are physically distinct and separate from one another. In some instances thereof, the apparatus further includes: a first heat exchanger disposed adjacent the first housing portion, wherein at least a portion of the first heat exchanger is in direct physical contact with an exterior surface of the first housing portion; and a second heat exchanger disposed adjacent the second housing portion, wherein at least a portion of the second heat exchanger is in direct physical contact with an exterior surface of the second housing portion; wherein the first heat exchanger and the second heat exchanger are physically distinct and separate from one another. In some other instances, the apparatus further includes at least one heat exchanger disposed adjacent the housing, wherein at least a portion of the at least one heat exchanger is in direct physical contact with an exterior surface of the housing. In some cases, the apparatus is configured for operation with the first end oriented upward and the second end oriented downward.

In some cases, a system is provided, the system including the aforementioned apparatus and at least one of the following in flow communication with the apparatus: at least one source of a polarizable noble gas; at least one source of an alkali metal vapor for saturating the polarizable noble gas; at least one saturator for saturating the polarizable noble gas with the alkali metal vapor; at least one source of an inert gas that is lighter than the polarizable noble gas; at least one desaturator for desaturating the polarizable noble gas of the alkali metal vapor; at least one reservoir for temporarily storing a polarized noble gas produced by the apparatus; and at least one source of an inert gas that is heavier than the polarizable noble gas. In some such instances, at least two of the following are in flow communication with the apparatus: the at least one source of the polarizable noble gas; the at least one source of the alkali metal vapor for saturating the polarizable noble gas; the at least one saturator for saturating the polarizable noble gas with the alkali metal vapor; the at least one source of the inert gas that is lighter than the polarizable noble gas; the at least one desaturator for desaturating the polarizable noble gas of the alkali metal vapor; the at least one reservoir for temporarily storing the polarized noble gas produced by the apparatus; and the at least one source of the inert gas that is heavier than the polarizable noble gas. In some other such instances, each of the following is in flow communication with the apparatus: the at least one source of the polarizable noble gas; the at least one source of the alkali metal vapor for saturating the polarizable noble gas; the at least one saturator for saturating the polarizable noble gas with the alkali metal vapor; the at least one source of the inert gas that is lighter than the polarizable noble gas; the at least one desaturator for desaturating the polarizable noble gas of the alkali metal vapor; the at least one reservoir for temporarily storing the polarized noble gas produced by the apparatus; and the at least one source of the inert gas that is heavier than the polarizable noble gas.

In accordance with some example embodiments, a polarization chamber may be provided having an interior where a laser interacts with a gas mixture depositing heat and an exterior that serves to exhaust unwanted heat. One portion of the polarization chamber—the laser beam entrance end— may be made of glass, allowing the laser light to enter from the exterior to the interior. Other portions of the surface—the wall(s)—may be beneficially aligned with the laser propagation direction. The back end may be opposite the laser end. Outside the polarization chamber, a thermal conduction and reservoir system may be introduced, being implemented in such a way so that it can maintain the temperature of the at least one region of the chamber wall(s) or back end to be generally stable regardless of whether there is intense laser illumination. In some cases, a portion of the polarization chamber may be at least partially contacted by a liquid bath. Such contact can be accomplished by immersion or partial immersion in an open container of liquid, by immersion or partial immersion in a closed container of liquid, or by contact of the polarization chamber surface with a surface of an open or closed container of liquid. In some cases, a portion of the polarization chamber may be at least partially contacted by a solid structure. Such contact can be accomplished by conforming the shape of the solid so that contact with the polarization chamber surface is enhanced. Further enhancement may be accomplished by introducing a thermally conductive grease or mesh in the region of contact. In some cases, a portion of the polarization chamber may be at least partially contacted by a structure consisting of both solid and liquid elements. In some cases, the above thermal reservoirs may be enclosed in a conductive metal container that is placed in thermal contact with the polarization chamber. In some instances, the polarization chamber may be placed directly in the liquid, so that the walls of the polarization chamber are immersed in the liquid. In some instances, the liquid may circulate within the walls of the polarization chamber. In some cases, one or more thermal reservoirs may be a solid, which serves to conduct heat away from hot spots, thereby equilibrating temperature. In some instances, the solid may be copper (Cu) or an alloy thereof. In some cases, one or more of the thermal reservoirs may be a liquid that serves both as a heat-exchange medium and a reservoir. In some instances, the fluid may be water. In some instances, the fluid may be an oil, such as a silicone oil. In some cases, the liquid is in motion.

In accordance with some example embodiments, a polarization chamber may be provided having an interior where a laser interacts with a gas mixture depositing heat and an exterior that serves to exhaust unwanted heat. One portion of the polarization chamber—the laser beam entrance end— may be made of glass, allowing the laser light to enter from the exterior to the interior. The back end may be opposite the laser end. Other portions of the interior surface—the wall(s)—may be mostly beneficially aligned with the laser propagation direction to maximize the fraction of the interior volume that is illuminated by the laser. It is often the case that there is a region of the interior volume protruding outward from a beneficially aligned wall, such that this region is not illuminated by the laser. In particular, the region is usually the nipple from a seal-off of tubing utilized to transfer alkali metal into the polarization chamber. Because this region is not illuminated, it often contains liquid alkali metal. In some cases, a plurality of regions protrudes outward from a beneficially aligned wall, such that these regions are not illuminated by the laser. In some cases, the portion of the polarization chamber that is a region (or regions) that protrudes outward from a beneficially aligned wall, such that these region(s) are not illuminated by the laser, also may be thermally stabilized by contact with a liquid or solid. In some cases, the region(s) that protrude outward from a beneficially aligned wall protrude gravitationally downward. In some cases, the region(s) that protrude outward protrude from the end. In some instances, although these region(s) may be illuminated by the laser, they nevertheless may be thermally stabilized sufficiently by their higher surface area and intimate contact with thermally stabilized surfaces. In some instances, the polarization chamber may be oriented vertically, the laser may be propagating downward, and the region(s) that protrude outward from the back end may be protruding gravitationally downward.

In accordance with some example embodiments, a polarization chamber may be provided having an interior where a laser interacts with a gas mixture depositing heat and an exterior that serves to exhaust unwanted heat. One portion of the chamber—the laser beam entrance end—may be made of glass, allowing the laser light to enter from the exterior to the interior. Other portions of the surface—the wall(s)—may be beneficially aligned with the laser propagation direction. The back end may be opposite the laser end. Outside the polarization chamber, a thermal conduction and reservoir system may be introduced, being implemented in such a way so that it can maintain the temperature of the at least one region of the polarization chamber wall(s) or back end to be generally stable regardless of whether there is intense laser illumination. In closer proximity to the polarization chamber walls, local heaters that provide greater heating when the laser is off than when it is on may be incorporated. In some cases, the thermal system may incorporate a heat transfer plate surface with a power removal capability approximately equal to that of the laser power. A large surface area and low temperature difference may minimize the temperature rise when the laser is turned on. In some cases, the thermal system also may incorporate a heater with a power output approximately equal to that of the laser, which replaces the power of the laser when the laser is off, thereby maintaining the thermal distribution and direction of heat flow regardless of the laser illumination. In some cases, the local heaters may be positioned to provide heat to the wall(s) and/or back of the polarization chamber to reduce the changes in the thermal distribution between the periods when the laser is on and when it is off. In some cases, the local heaters may be operated to provide heat to the wall(s) and/or back of the polarization chamber to reduce the changes in the thermal distribution between the periods when the laser is on and when it is off.

In accordance with some example embodiments, a polarization chamber may be provided having an interior where a laser interacts with a gas mixture depositing heat and an exterior that serves to exhaust unwanted heat. One portion of the polarization chamber—the laser beam entrance end—may be made of glass, allowing the laser light to enter from the exterior to the interior. Other portions of the surface—the wall(s)—may be beneficially aligned with the laser propagation direction. The back end may be opposite the laser end. At least one surface of the side wall(s) or back end may utilize metal to enhance thermal conductivity. In some cases, one or more surfaces of the polarization chamber may be fabricated of metal. In some cases, the one or more surfaces of the polarization chamber that are fabricated of metal may be at least partially clad in a thin layer of another material to reduce relaxation of the polarization. In some instances, this cladding material may be a glass.

In accordance with some example embodiments, a polarizing chamber may be provided having an interior where a laser interacts with a gas mixture depositing heat and an exterior that serves to exhaust unwanted heat. One portion of the chamber—the laser beam entrance end—may be made of glass, allowing the laser light to enter from the exterior to the interior. Other portions of the surface—the wall(s)—may be beneficially aligned with the laser propagation direction. The back end may be opposite the laser end. Inside the polarization chamber, additional surface area may be introduced to augment the thermal transfer capabilities of the polarization chamber. In some cases, the additional surface projecting into the interior of the enclosure for transferring heat from a gas mixture to one or more of the enclosure wall(s) or through the back end, and thus able to deposit heat to one or more thermal reservoirs, may be beneficially aligned with the laser propagation direction to minimize the interception of the laser light and/or causing of shadowing resulting in unilluminated volumes within the polarization chamber. In some cases, at least one fin may project into the interior of the enclosure for transferring heat from a gas mixture to one or more of the enclosure wall(s) or through the back end to one or more thermal reservoirs. In some case, at least one partitioning device may project through the interior of the enclosure for transferring heat from a gas mixture to one or more of the enclosure wall(s) or through the back end to one or more thermal reservoirs. In some cases, at least one heat pipe may project into the interior of the enclosure for transferring heat from a gas mixture to one or more of the enclosure wall(s) or through the back end to one or more thermal reservoirs. In some cases, the partitioning device may be a column structure having a plurality of planar walls defining a plurality of channels to present a geometrical obstruction to the propagation of laser light that is low. In some cases, the enclosure and the at least one partitioning device may be at least partially made of a thermally conductive material. In some instances, the enclosure and the partitioning device may be at least partially made of copper (Cu) or aluminum (Al) or an alloy of any thereof. In some cases, some or all of the surface area of the thermally conducting projections may be clad with a thin layer of material that will withstand the harsh conditions in the polarization chamber and modify the nuclear polarization relaxation of the noble gas by forming a barrier between the noble gas atoms and the thermally conductive material, while still being sufficiently thin to allow effective thermal stabilization. In some instances, the material may be a thin glass. In some cases, at least one heat pipe may project from the back end into the volume of the polarization chamber to present a geometrical obstruction to the propagation of laser light that is low. In some cases, the alkali metal reservoir may be in a temperature-stabilized region of the polarization chamber where the laser illumination is remote, reduced, or otherwise absent. In some instances, this temperature-stabilized region with reduced illumination may be sufficiently remote from the fully illuminated gas being polarized that diffusive mixing of lesser polarized gas and more polarized gas is reduced. In some cases, the alkali metal reservoir may be considered as a separate temperature-controlled chamber where the mixed gas resides before it is transferred into the polarization chamber. In some instances, this chamber may incorporate additional surface area, such as a corrugated foil sheet or wicking material, for exposing a larger surface area of gas to the alkali metal liquid.

In some cases, the laser propagation direction may be approximately vertically downward and aligned with a transparent laser window and a preferred axis of the polarization chamber, so that a lightweight gas may be introduced such that it floats above the noble gas mixture, thereby protecting the laser window. In some instances, the lightweight gas has a lower concentration of alkali metal vapor. In some cases, the lightweight gas and the noble gas mixture may contribute to providing an overall polarization chamber gas pressure such that, upon completion of the polarization process, the polarized noble gas mixture may flow into bags in a normal atmospheric environment. In some instances, the lightweight gas and the noble gas mixture may contribute to providing an overall polarization chamber gas pressure such that, upon completion of the polarization process, the polarized noble gas mixture may flow into bags in an evacuated environment maintained at pressure below one atmosphere. In some cases, the lightweight gas and the noble gas mixture contribute to providing an overall polarization chamber gas pressure such that the partial-pressure of nitrogen concentration required in the mixture for the polarization process includes as low as possible a dilution of the noble gas in the bags. In some cases, the lightweight gas has a mass density less than that of the laser-heated noble gas mixture, such that gravitational buoyancy does not invert or dynamically mix the one gas mixture with the other.

In some cases, the lightweight gas may be nitrogen. In some cases, the lightweight gas may be argon. In some cases, the lightweight gas may be helium. Other non-reactive gases or a mixture of gases may be substituted. In some cases, the lightweight gas may be a spatially-varying arrangement of layers or a spatially-varying mixture that is lighter on top and heavier on the bottom, so that even if the lower part becomes heated, it does not have sufficient buoyancy to rise against gravity. In some cases, the lightweight gas mixture may be a mixture of argon, nitrogen, and/or helium, containing a greater concentration of helium and/or nitrogen nearest the laser window and a greater concentration of nitrogen and/or argon near the noble gas mixture. In some cases, the lightweight gas mixture may be mostly devoid of alkali metal vapor and may form a protective layer below the laser window and above the gas mixture being polarized, so as to reduce damage to the laser window.

In some cases, regardless of whether the laser propagation direction is vertical or horizontal, a lightweight gas may be introduced into the topmost region of the polarization chamber after polarization is completed to assist in the displacement of the polarized noble gas mix out through a port in the bottom. In some cases, the nitrogen partial pressure in the noble gas mixture may be about 100 torr. At an overall pressure of about 1,000 torr, nitrogen may constitute about 10%. At an overall pressure of about 2,000 torr, nitrogen may constitute about 5%. In some cases, the nitrogen partial pressure in the noble gas mixture may be about 130 torr. At an overall pressure of about 1,000 torr, nitrogen may constitute about 13%. At an overall pressure of about 2,000 torr, nitrogen may constitute about 7%. Other concentrations within and outside these ranges may be provided.

In accordance with some example embodiments, the lightweight gas first may be introduced into a polarization chamber without passing through an alkali vapor saturation chamber. Next, a gas mixture containing the noble gas may enter from the alkali vapor saturation chamber through an inlet in the bottom, which may compress the lightweight gas into the upper region of the polarization chamber. The laser may illuminate the gases, polarizing the noble gas nuclei. Within the polarization chamber, some diffusion may occur between the lightweight gas and the noble gas mixture. The polarized noble gas mixture may be extracted from an outlet at the bottom and delivered into bags. While the noble gas mixture is extracted, some, all, or none of the lightweight gas also may be extracted.

In accordance with some example embodiments, the noble gas mixture may enter from the alkali vapor saturation chamber through an inlet in the top. Bypassing the alkali vapor saturation chamber, a lightweight gas then may be introduced through an inlet in the top, which compresses the noble gas mixture into the lower region of the polarization chamber. The laser may illuminate the gases, polarizing at least the upper portion of the noble gas. The lightweight gas may be extracted from the top outlet and exhausted. The portion of the noble gas mixture that has become beneficially polarized then may be extracted.

In accordance with some example embodiments, a polarization chamber first may be evacuated. Polarizable noble gas mixture may enter from an alkali vapor saturation chamber through an inlet. The lightweight gas (without alkali vapor) then may be introduced through an inlet in the top, which compresses the polarizable noble gas mixture into the lower region of the polarization chamber. The laser may illuminate the gases, polarizing some or all of the noble gas mixture. The polarized noble gas mixture may be extracted from a bottom outlet and delivered into bags. Additional lightweight gas may be introduced at the top inlet to displace the remaining noble gas mixture, which may flow out through the bottom outlet.

In accordance with some embodiments, a polarization chamber first may be evacuated. Polarizable noble gas mixture may enter from an alkali vapor saturation chamber through an inlet. The laser may illuminate the gases, polarizing some or all of the noble gas mixture. A valve at the bottom of the polarization chamber may be opened. The lightweight gas (without alkali vapor) then may be introduced through an inlet in the top, which displaces the polarized noble gas mixture out through a port in a lower region of the polarization chamber.

In accordance with some embodiments, an alkali metal vapor may be removed from a noble gas mixture before it is transferred into delivery bags by introducing a thermal fluid maintained at a cooler temperature into the channels contacting the polarization chamber, thereby reducing the temperature of the walls of the polarization chamber. In accordance with some embodiments, an alkali metal vapor may be removed from a noble gas mixture before it is transferred into delivery bags by transferring the gas mixture from a polarizing chamber through a desaturation chamber with a temperature gradient along its length, dedicated for gradually cooling the gases and removing the alkali vapor by condensation to the walls. In some cases, the desaturation chamber may take advantage of additional surface area by being designed and fabricated with at least one short dimension and at least one long dimension. In some instances, it may be designed and fabricated as a tube in a helical shape. In some cases, the desaturation chamber may take advantage of its at least one long dimension by distributing a temperature gradient at least partially along the at least one long dimension. In some cases, the desaturation chamber may take advantage of its at least one short dimension by promoting a higher cooling rate due to greater surface area and by reducing the time for diffusion of the vapor to migrate to the surface of the at least one short dimension and condense out. In some cases, the desaturation chamber may take advantage of its at least one long dimension to minimize mixing of gases in different regions of the at least one long dimension. In some cases, the desaturation region already may contain a gas at a pressure that is lower than that of the polarization chamber as the polarization process reaches completion. At that moment, opening a valve between the polarization chamber and the desaturation chamber may cause gases to flow from the polarization chamber to the desaturation chamber. In some cases, the desaturation region may be above the polarization chamber and the gas already present in this region may have density equal to or lesser than the noble gas mix. In some cases, the desaturation region may be below the polarization chamber and the gas already present in this region may have a density equal to or greater than the noble gas mix. In some cases, the gas that flows may include the full amount of noble gas mixture. In some instances, the noble gas mixture that is transferred also may be followed by an additional amount of lightweight gas, such that the additional lightweight gas displaces the noble gas mixture beyond the temperature-gradient region of the desaturation chamber, so that essentially all of the noble gas mixture exits the region with a temperature gradient, has become desaturated and cooled, and resides in a portion of the desaturation chamber that is approximately at (or below) room temperature. In some embodiments, when the noble gas mixture (and optionally some of the lightweight gas) is transferred to the desaturation chamber, the pressure of the desaturation chamber may rise such that, at some time later, opening another valve may allow essentially all of the desaturated noble gas mixture to flow into one or more gas delivery bags for beneficial use.

The features and advantages described herein are not all-inclusive and, in particular, many additional features and advantages will be apparent to one of ordinary skill in the art in view of the drawings, specification, and claims. Moreover, it should be noted that the language used in the specification has been selected principally for readability and instructional purposes and not to limit the scope of the inventive subject matter.

Figure 1:
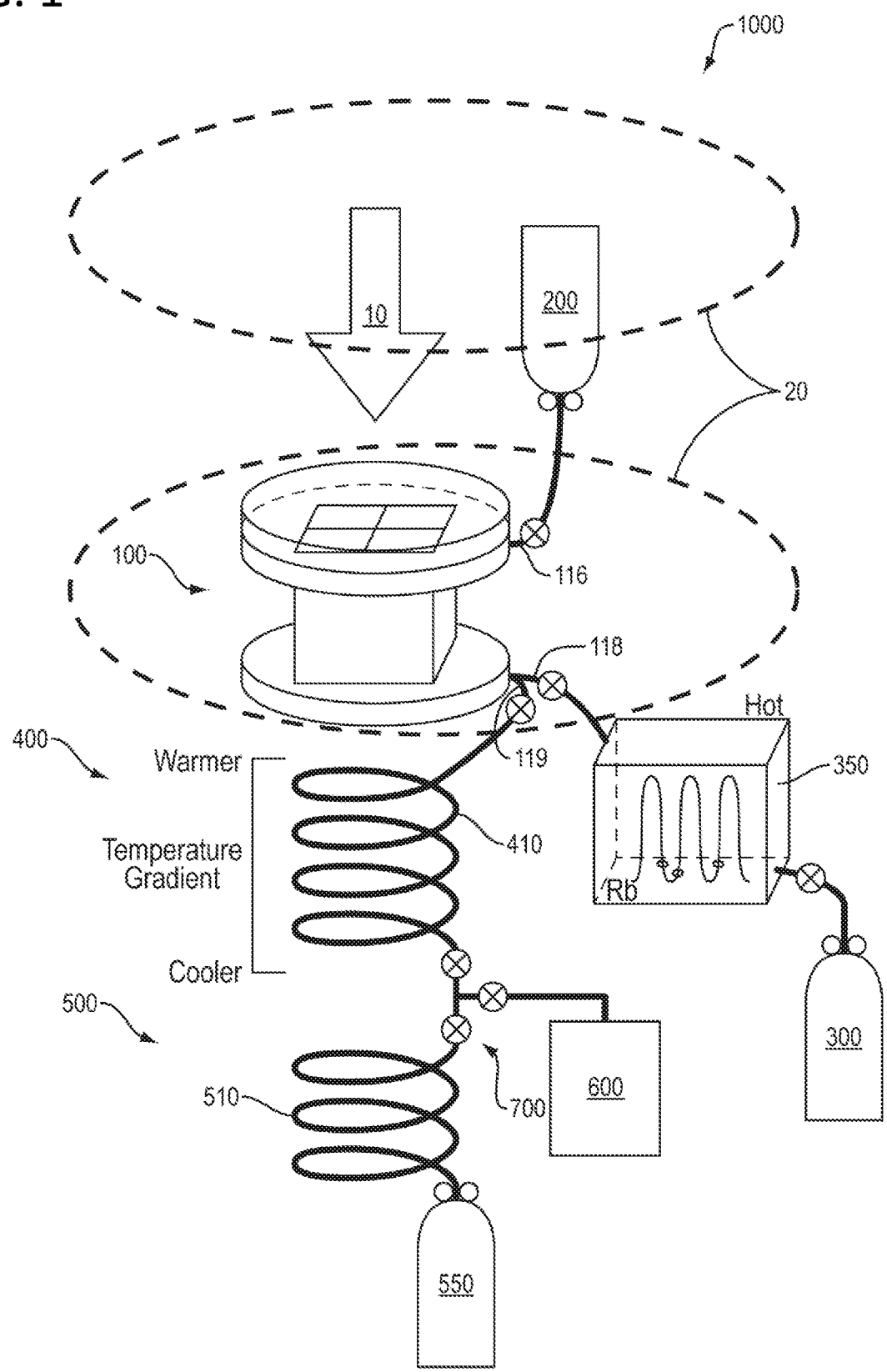
FIG. 1 is a diagram of a noble gas polarization system configured in accordance with an embodiment of the present disclosure.

These and other features of the present embodiments will be understood better by reading the following detailed description, taken together with the figures herein described. In the drawings, each identical or nearly identical component that is illustrated in various figures may be represented by a like numeral. For purposes of clarity, not every component may be labeled in every drawing. Furthermore, as will be appreciated in light of this disclosure, the accompanying drawings are not intended to be drawn to scale or to limit the described embodiments to the specific configurations shown.

DETAILED DESCRIPTION

An apparatus, system, and methods for polarizing nuclei of a noble gas are disclosed. In accordance with some embodiments, the disclosed system may include a polarization apparatus configured to polarize a noble gas mixture including xenon-129. The disclosed system also may include separate volumes for (1) saturating the polarizable noble gas mixture with alkali metal vapor, (2) desaturating said noble gas mixture from its alkali metal vapor after polarization is completed, (3) intermediate storage of the resultant polarized noble gas mixture, and (4) transfer of said polarized noble gas mixture to a storage vessel (e.g., a delivery bag), in accordance with some embodiments. The disclosed system also may include separate reservoirs for (1) the noble gas(es) to be polarized, (2) lightweight gas(es) to displace the noble gas(es), and (3) a heavy inert gas (e.g., such as natural xenon) to push the polarized noble gas(es) into a storage vessel, in accordance with some embodiments. Numerous configurations and variations will be apparent in light of this disclosure.

General Overview

One existing example system for hyperpolarizing xenon-129 employs a polarizing chamber, a thermal control system, circularly polarized laser light, and a magnetic field. In this existing example system, the polarizing chamber has a circular sidewall that encloses an interior volume, with at least one opening for allowing gas to enter and/or exit and a transparent window by which polarizing light enters. The thermal control system prepares the surface temperatures of the system to allow for establishing and maintaining a controlled rubidium (Rb) vapor concentration in the xenon-129 gas mixture. The magnetic field and laser are positioned so that laser light propagates generally along the direction of the magnetic field to enter through the transparent window into the interior of the polarizing chamber. To maximize illumination of the interior volume and minimize casting of shadows, much of the interior surface area of the chamber wall enclosure is aligned along the direction of laser propagation. Utilizing this existing example system, hyperpolarized xenon-129 gas nuclei may be produced in several steps. In one step, a mixture of gases containing the polarizable xenon-129 gas and nitrogen quenching gas is transported within the system, either continuously or in stages. In another step, a reservoir of at least one alkali metal and a thermal environment is provided such that the gas mixture acquires the desired concentration of an alkali metal vapor, either before or during polarization. In another step, circularly polarized laser light is propagated into the polarizing chamber such that it illuminates the gas mixture. In another step, the polarizing cell is immersed in a magnetic field. With this existing example system, the gas transport through the polarization chamber, the acquiring of the alkali vapor by the gas mixture, the propagation of the circularly polarized laser light, and the magnetic field immersion must be active concurrently for polarization to occur and the polarized xenon-129 gas mixture subsequently to be made available for beneficial uses.

In existing practice, two conceptual design architectures support two different modes of operation. In a first approach, continuous flow-through polarization systems utilize concurrently an entrance and exit on the polarizing chamber for the gas mixture. This scheme allows the xenon-129 gas mixture to traverse a polarizing chamber under illumination from the laser such that it increases its polarization level. Optimal polarization is achieved if the illumination occurs over a transit time that is commensurate with a multiple of the polarization spin-up time. After polarization, the polarized xenon-129 gas mixture is accumulated cryogenically over a production period until a sufficient quantity is produced, which is then thawed and made available for use. In a second approach, batch-mode polarizers prepare the polarization chamber containing a sufficient quantity of the xenon-129 gas mixture so that the laser illuminates the full quantity of gas for the entirety of the illumination period. Optimal polarization is achieved if the illumination occurs over a resident duration that is commensurate with a multiple of the spin-up time. After polarization, the polarized xenon-129 gas mixture can become directly available for beneficial use.

Polarization chambers for such batch-mode polarizers commonly are cylindrical glass tubes with hand-blown domed glass end-windows. As the noble gas nuclei become oriented during the spin-exchange optical pumping process, they simultaneously lose their orientation by collisional relaxation with the chamber walls. Current practice recognizes this adverse condition by effectively minimizing the wall surface area. Some apparatuses utilize spherically shaped pumping chambers, whereas others utilize ovoid shapes to compromise between minimizing surface area while also extending the path of the laser within the chamber. Some apparatuses utilize cylindrical shapes, minimizing surface area along at least two of the three dimensions while providing an optically flat window for the laser to enter. Current batch-mode polarizers have spin-up times in the range of 30-60 minutes, requiring wall relaxation lifetimes of that order or greater. Consequently, introducing additional surface area into the polarization chamber for any purpose runs counter to current practice.

Also, polarization chambers for such batch-mode polarizers commonly are made from glass. As the noble gas nuclei become polarized during the spin-exchange optical pumping process, they simultaneously lose their polarization by collisional relaxation with the chamber walls. Current practice recognizes this adverse condition by fabricating the chamber from a material known to minimize nuclear relaxation. Consequently, introducing additional materials with higher relaxation rates into the polarization chamber for any purpose runs counter to current practice.

Furthermore, polarization systems for batch-mode polarizers commonly utilize nuclear magnetic resonance (NMR) to monitor polarization during the process. Radiofrequency (RF) signals for NMR are attenuated in metal-walled chambers, preventing the use of metal for chamber walls. Furthermore, electromagnetic oscillations produce eddy currents in conducting materials that are placed in proximity to the NMR, effectively establishing a region and a perimeter inside which no metal objects are normally located. Consequently, introducing additional metal components (such as heaters, coolers, or remotely controlled valves) in proximity to the polarization chamber runs counter to current practice.

Additionally, polarization chambers for batch-mode polarizers commonly avoid electrical currents in the vicinity of the polarization chamber due to the desire to establish and maintain uniform magnetic field environments. A common thermal management system that elevates the temperature of the gas mixture from room temperature in order to achieve an optimal rubidium (Rb) vapor density in the gas mixture uses circulating air that is electrically heated at a remote location and thermostatically controlled. In some cases, inclusion of a thermoelectric component, also placed remotely, can cool this air and circulate it to the vicinity of the polarization chamber for accelerating the cool-down cycle. Consequently, introducing additional electrically operated components (such as heaters or remotely controlled valves) in proximity to the polarization chamber runs counter to current practice.

Of further note, existing batch-mode hyperpolarized gas production systems suffer from numerous non-trivial limitations to the laser power that can be used beneficially. For instance, one non-trivial limitation is the non-linear thermal runaway that occurs in batch-mode systems with increased laser power and insufficient thermal stabilization. Absorption of the laser power in the xenon-129 gas mixture causes a localized increase in temperature. Nearby sources of rubidium (e.g., condensed Rb droplets) release additional vapor. The locally elevated concentration of rubidium vapor absorbs more laser light, further raising the temperature of the gas mixture and the local concentration of rubidium vapor. The region of higher rubidium concentration depletes the laser power, preventing the light from penetrating more deeply into the polarizing chamber. Consequently, lasers with increased power for production of polarized xenon-129 have not yielded a commensurate increase in the output polarization and the production quantities in batch-mode systems.

Another non-trivial limitation of existing approaches is the elevation of the central temperature in a cylindrical cell geometry with low surface area. If the cell volume is increased with the specific laser absorption kept constant, the chamber walls are further away from the polarization process, thereby decreasing their ability to cool the gas. Similarly, if the cell volume is kept constant and the specific laser absorption is increased by increasing the vapor concentration, then more power is deposited in the same volume, also increasing the demands on the thermal stabilization of the system. For the case where the dimension of the chamber transverse to the laser beam is increased, the increased distance from the center of the chamber to the edge lowers the thermal conductance from center to edge and increases the gas temperature at the center. Both approaches result in increased temperature of the gas mixture. It is detrimental to the operation of the polarizer if laser absorption is permitted to cause elevation in temperature significantly beyond that optimal temperature.

Yet another non-trivial limitation of existing approaches is the choice of glass containers with a wall thickness to withstand vacuum and high-pressure gas as the material for the polarizing cell. Although it allows transmission of RF signals and acquisition of NMR measurements, glass is a poor thermal conductor. When heated from one side and cooled on the other, glass containers with a wall thickness sufficient to withstand elevated gas pressure will establish a temperature gradient through their thickness. An alkali metal droplet in contact with the glass interior surface and subject to heating from the laser-illuminated gas will come to equilibrium at a temperature that is elevated relative to the outside environment. Consequently, the glass can be considered as a thermal insulator that allows its interior surface temperature to rise and fall depending on the local specific absorption of laser light by the gas.

Other non-trivial limitations of existing approaches include the remoteness of the thermal reservoir outside the glass-walled polarizing chamber and the low rate of heat transfer of the medium conducting heat between the polarizing chamber and that reservoir. Particularly, current practice universally employs thermostatically controlled flowing air. Temperature-controlled air is utilized for raising the temperature of the polarization chamber during the warm-up phase, loss of heat to the room-temperature ambient environment serves to maintain that temperature at low laser power by carrying heat away, and this same cooling rate serves to cool down the chamber after the process is completed and the laser turned off. However, air does not provide sufficient conductivity or heat capacity for thermally stabilizing a polarizing chamber for higher laser powers. Moreover, air is transparent to the laser, does not interfere with RF signals of NMR, and is inexpensive to implement and control. Consequently, inclusion of a thermally conductive solid or liquid material inside or near the polarization chamber to transfer heat away from the polarization chamber to a thermally stabilized reservoir elsewhere is not suggested by current practice. Additionally, inclusion of a nearby thermal reservoir with high heat capacity and thermal conductivity is not suggested by current practice.

Another non-trivial limitation of existing batch-mode polarizers is the time required for the heated air to ramp-up the temperature of the polarizing chamber before polarizing and the associated time required for diffusive distribution of the alkali metal vapor throughout the gas mixture within the polarizing cell once it becomes warm. Therefore, the time required for a complete polarization cycle includes additional warm-up steps, thereby decreasing the beneficial production rate of hyperpolarized noble gas.

Yet another non-trivial limitation of existing batch-mode polarizers is the time required for loss of heat to the room-temperature surroundings to ramp-down the temperature, and the associated time for diffusive removal and condensation of the alkali metal vapor before the gas can be removed from the polarizing apparatus and transferred to a bag for beneficial use. Even with the use of thermoelectric coolers in an existing apparatus to remove heat from the circulating air more quickly, the rate of heat being transferred to the cooler surface from the flowing circulating air, and thereby the cooling of the polarizing cell, is low. Therefore, the time required for a complete polarization cycle includes additional cool-down steps, thereby decreasing the beneficial production rate of hyperpolarized noble gas.

Another non-trivial limitation of existing batch-mode polarizers is the fraction of polarized gas that can be removed from the polarizing cell and beneficially transferred to the bags. Since the bags are filled at 1 atmosphere (absolute pressure), the gas in the polarizer must exceed 1 atmosphere for any gas to be transferred. After the gas transfer is completed, the gas pressure remaining in the polarization chamber is lowered, but only to a minimum pressure of 1 atmosphere. Therefore, the fraction of the gas that was polarized that is subsequently transferred to the bags is less than unity, thereby decreasing the beneficial production rate of hyperpolarized noble gas.

Yet another non-trivial limitation of existing batch-mode polarizers is the limited lifespan of the laser window. Alkali metal vapor in the central interior of the cell that becomes polarized retains its polarization for a longer time than alkali metal vapor that is in collisional contact range of the laser window. Gas mixture that is in diffusive contact with the illumination window can absorb many more photons per second, releasing more heat. Furthermore, this high-energy deposition can result in formation of clusters that can lead to pitting of the window.

Given the aforementioned, in order to effectively utilize the higher power available from recently developed polarizing lasers for increasing polarized noble gas output production rates in batch-mode hyperpolarizer systems, one must address multiple concerns related to limiting the temperature increase of the gas in the polarizing chamber and reducing the concomitant transfer of heat from laser-illuminated gas to pools of alkali metal. Further increases in performance may be gained if such improvements are accomplished while simultaneously (1) reducing the time lost during warm-up and saturation of the gas with alkali metal, (2) reducing the time lost during the cool-down of the gas and extraction of the alkali metal vapor, and (3) increasing the fraction of the gas that was polarized into the gas delivery bags for beneficial use.

Thus, and in accordance with some embodiments of the present disclosure, an apparatus, system, and methods for polarizing nuclei of a noble gas are disclosed. In accordance with some embodiments, the disclosed system may include a polarization apparatus configured to polarize a noble gas mixture including xenon-129. The disclosed system also may include separate volumes for (1) saturating the polarizable noble gas mixture with alkali metal vapor, (2) desaturating said noble gas mixture from its alkali metal vapor after polarization is completed, (3) intermediate storage of the resultant polarized noble gas mixture, and (4) transfer of said polarized noble gas mixture to a storage vessel (e.g., a delivery bag), in accordance with some embodiments. The disclosed system also may include separate reservoirs for (1) the noble gas(es) to be polarized, (2) lightweight gas(es) to displace the noble gas(es), and (3) a heavy inert gas (e.g., such as natural xenon) to push the polarized noble gas(es) into a storage vessel, in accordance with some embodiments. The disclosed system may be configured to utilize two or more gases (or mixtures of gases) that are regionally segregated by their gravitational weight density, in accordance with some embodiments.

In accordance with some embodiments, the disclosed system may utilize solid and/or liquid materials to provide spatial distributions of (1) temperatures and (2) alkali metal vapor concentrations throughout and among one or more separate chambers. In accordance with some embodiments, the disclosed system may utilize the buoyancy of different gas species to displace and effectuate movement of a polarized noble gas. In accordance with some embodiments, a polarization chamber of the disclosed system may include a thermally conductive partitioning system, optionally having thermal fluid flowing inside one or more channels, which serves to limit elevation of the temperature of the polarization chamber where laser light is maximally absorbed. In accordance with some embodiments, by separating the several volumes and employing the disclosed partitioning system, increases in laser power (e.g., by a factor of five or more) can be beneficially utilized to polarize xenon or other heavy noble gas.

In accordance with some embodiments, use of techniques disclosed herein may achieve rates of production of polarized $^{129}$Xe not obtainable via existing polarizing apparatuses and methods. In accordance with some embodiments, use of techniques disclosed herein may provide enhanced thermal-conduction pathways for heat to flow from the illuminated gas mixture while also reducing changes to the vapor concentration of the alkali metal.

As described herein, the disclosed system may include a polarizing chamber with attachments, augmentations, insertions, and protrusions with surface geometry and material composition to improve thermal stabilization, in accordance with some embodiments. In some cases, a region is provided that is thermally stabilized where a liquid alkali metal may come to equilibrium with its vapor, such that temperature changes due to the laser power's heating have a reduced influence on vapor concentration. While this may be accomplished for modest laser powers by providing for such a region with enhanced thermal stabilization in the interior of the polarizing chamber, even higher laser power may be beneficially utilized for polarizing if the liquid and vapor phases come to equilibrium in a physically separated location. Extraction of the alkali metal vapor from the gas mixture after polarization by condensation to the walls similarly can be enhanced by attachments, augmentations, insertions, and protrusions, either within the polarization chamber or in a physically separated chamber optimized for that purpose, in accordance with some embodiments. Methods that deploy different gases and gas mixtures with gravitational stratification, maintained at the same or different temperatures and different alkali vapor concentrations, can provide further benefit, in accordance with some embodiments.

Also, as described herein, the disclosed system may utilize a first chamber for establishing a vapor concentration, a second chamber for illuminating and polarizing the gas mixture, a system that provides for gas density stratification in order to displace the polarized gas after polarization, and a third chamber for vapor extraction, at least in some cases. In accordance with some embodiments, such a system may overcome existing non-trivial limitations to utilize beneficial increases in laser power (e.g., by a factor of five or more) for polarizing a batch of noble gas mixture. Accordingly, the disclosed system and techniques of polarizing noble gas nuclei may achieve higher rates of hyperpolarized noble gas production, also achieving higher levels of polarization, at least in some instances.

System Architecture and Operation

Figure 2:
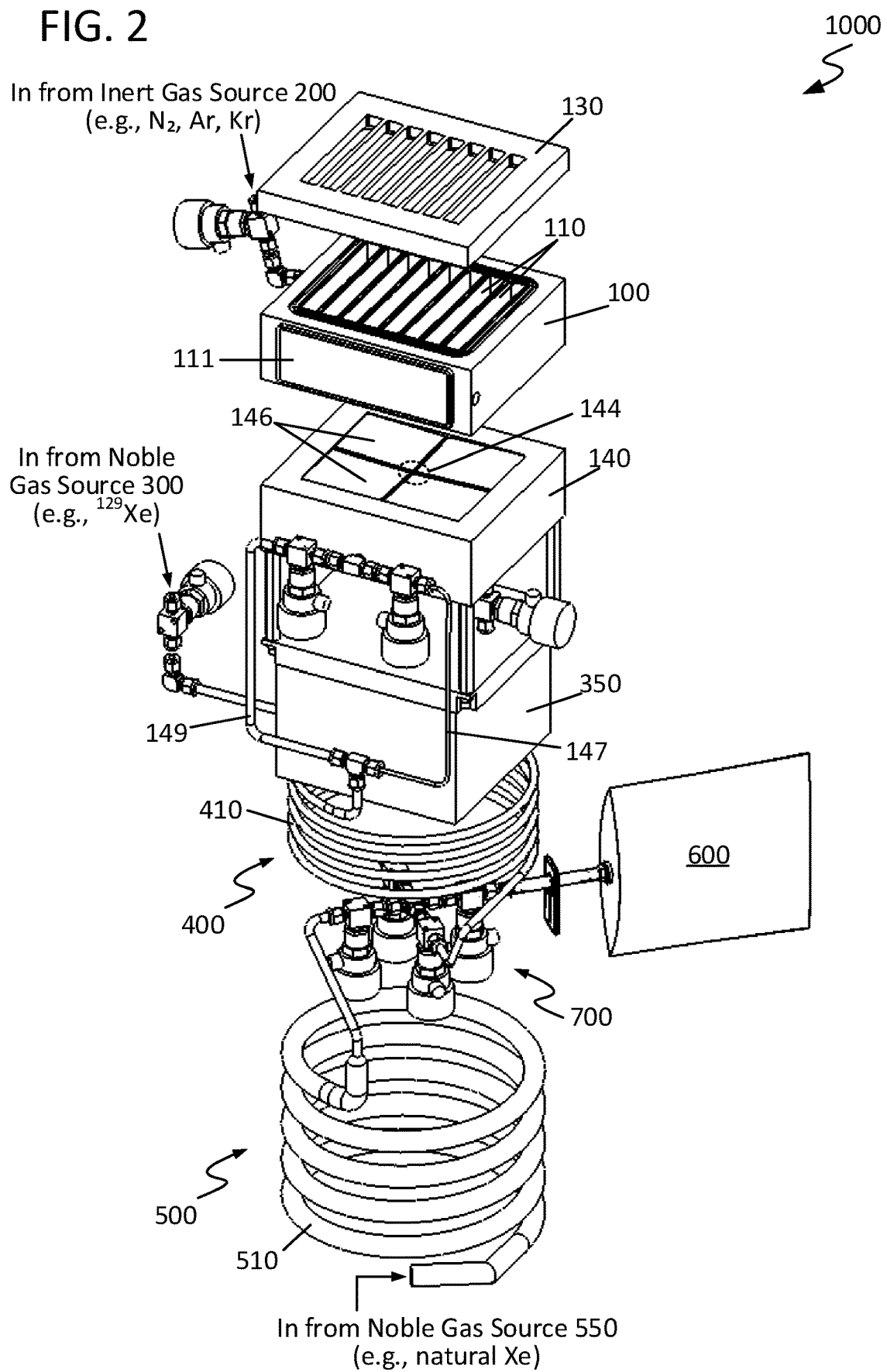
FIG. 2 is a diagram of a noble gas polarization system configured in accordance with another embodiment of the present disclosure.

FIG. 1 is a diagram of a noble gas polarization system 1000 configured in accordance with an embodiment of the present disclosure. FIG. 2 is a diagram of a noble gas polarization system 1000 configured in accordance with another embodiment of the present disclosure. As can be seen, system 1000 may include: (1) a polarization chamber 100; (2) an inert gas source; (3) a noble gas source 300 and a saturator 350; (4) a desaturator 400; (5) a reservoir 500 and a gas source 550; and (6) a storage vessel 600. Each of these and other elements is discussed in turn below. More generally, FIGS. 1-2 illustrate communicative coupling of the various constituent elements of system 1000 and the overall flow of gases and other materials within system 1000, in accordance with some embodiments. Coupling may be provided by tubes, valves, and/or other suitable connection means, as will be apparent in light of this disclosure. Also, in accordance with some embodiments, multiple polarization chambers 100 may be employed, arranged as desired for a given target application or end-use. In an example case, at least four polarization chambers 100 may be arranged in a generally rectangular array for system 1000.

Also, as can be seen from FIG. 1, for example, polarization chamber 100 may be disposed, at least in part, in a magnetic field provided by magnetic field coils 20. The strength and other characteristics of the applied magnetic field may be customized, as desired for a given target application or end-use. Furthermore, as can be seen from FIG. 1, for example, polarization chamber 100 may be configured to receive laser light from laser 10. The laser light may be propagated in a direction along a magnetic field provided by the magnetic field coils 20 external to polarization chamber 100. The power and other characteristics of the applied laser light may be customized, as desired for a given target application or end-use. In some cases, the laser light may be of generally rectangular (e.g., square) cross-section, whereas in some other cases, a round (e.g., circular) cross-section may be provided.

Figure 3:
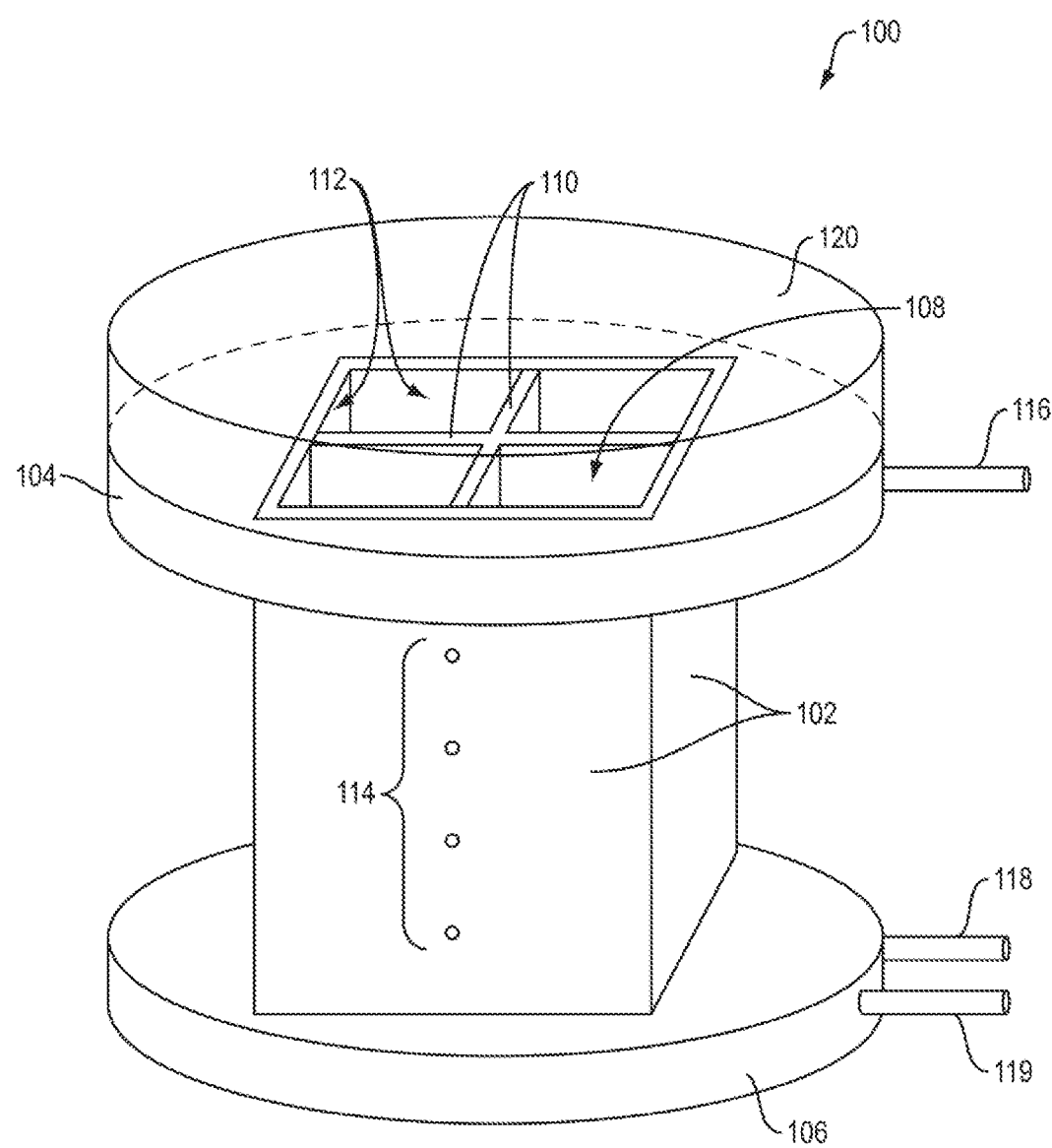
FIG. 3 is a diagram of a polarization chamber configured in accordance with an embodiment of the present disclosure.
Figure 4:
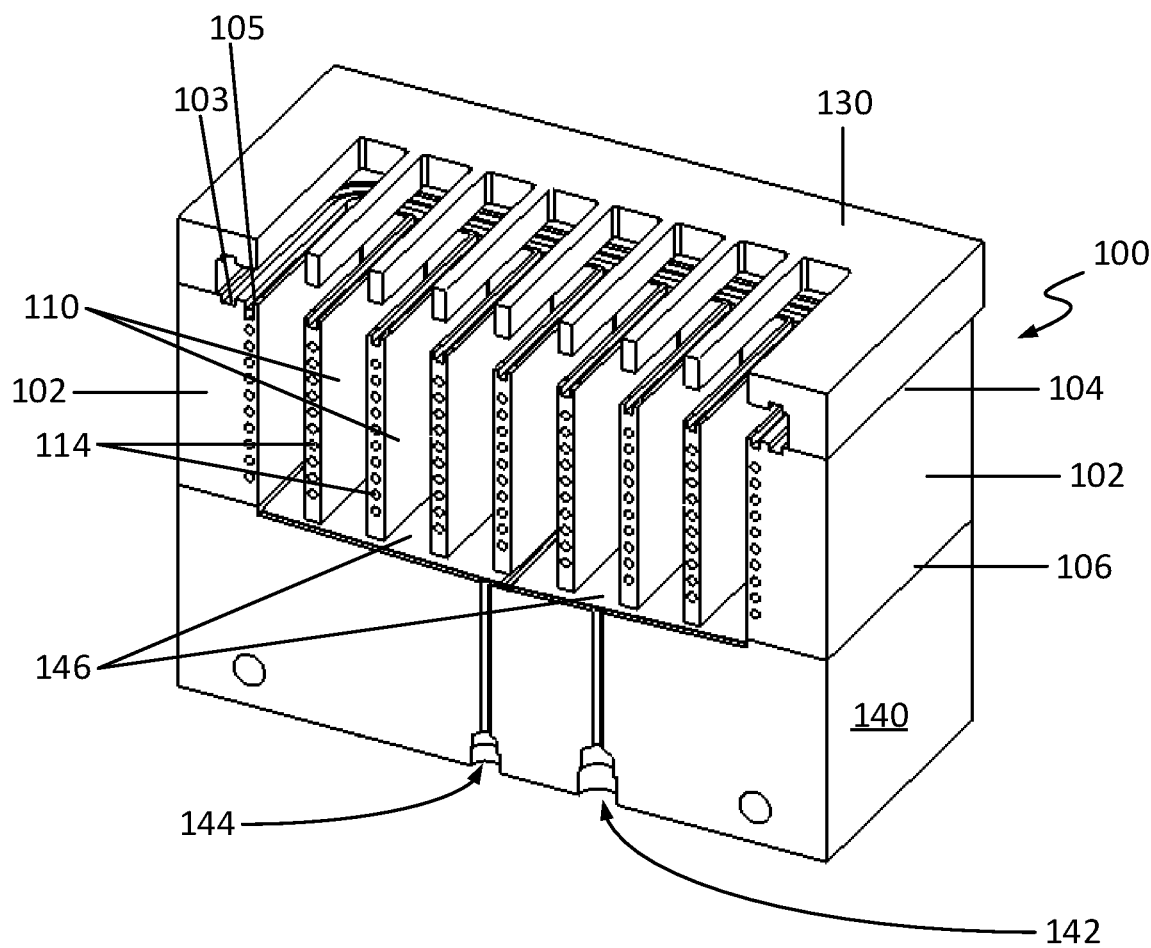
FIG. 4 is a cross-sectional view of a polarization chamber with an associated mask and baseplate configured in accordance with another embodiment of the present disclosure.

As noted above, system 1000 may include a polarization chamber 100. FIG. 3 is a diagram of a polarization chamber 100 configured in accordance with an embodiment of the present disclosure. FIG. 4 is a cross-sectional view of a polarization chamber 100 with associated mask 130 and baseplate 140 configured in accordance with another embodiment of the present disclosure. As can be seen from FIGS. 3-4, the body of polarization chamber 100 may include four generally planar walls 102 that form a box-like vessel of generally rectangular (e.g., square) cross-sectional geometry. The body of polarization chamber 100 may be constructed from a non-magnetic metal or alloy, such as, for example, copper (Cu), aluminum (Al), brass, or an alloy of any thereof, to name a few options. The dimensions of the body of polarization chamber 100 may be customized, as desired for a given target application or end-use. Polarization chamber 100 may be configured, in accordance with some embodiments, to have a preferred axis oriented approximately vertically.

Upper end 104 and lower end 106 of polarization chamber 100 may include inlet(s) and/or outlet(s), as desired. For example, as generally can be seen from FIGS. 1 and 3, upper end 104 may include at least one inlet 116 for coupling of an inert gas source 200 (discussed below) with polarization chamber 100. As generally can be seen further, lower end 106 may include at least one inlet 118 for coupling of a polarizable noble gas source 300 and saturator 350 (each discussed below) with polarization chamber 100. As generally can be seen further, lower end 106 may include at least one outlet 119 for coupling of a desaturator 400 (discussed below) with polarization chamber 100. In at least some cases, polarization chamber 100 may be configured such that heating of gases therein may avoid creating a buoyant instability.

Also, as can be seen from FIG. 3, for example, polarization chamber 100 may include a hollow interior region 108, and a plurality of partitions 110 (e.g., fins) may be disposed therein, crossing one or both transverse directions between walls 102. A given partition 110 may be configured to assist with stabilizing the temperature in polarization chamber 100 by transferring (e.g., adding and/or removing) heat via its thermal conductivity. To that end, a given partition 110 may be constructed from a non-magnetic metal or alloy, such as, for example, copper (Cu), aluminum (Al), brass, or an alloy of any thereof, to name a few options. The dimensions and quantity of a given partition 110 may be customized, as desired for a given target application or end-use. In some cases, a given partition 100 may be of substantially uniform thickness, whereas in some other cases, its thickness may vary in one or more regions. In some cases, a given partition 110 may be substantially planar in form, whereas in some other cases, one or more curvatures may be provided in one or more regions thereof. As will be appreciated in light of this disclosure, with such a configuration of partitions 110, any portion of hollow interior region 108 that may be shadowed from the illumination of laser 10 may be minimized (or otherwise reduced). In accordance with some embodiments, a given partition 110 may be aligned substantially parallel with the propagation direction of the laser light from laser 10, for instance, to minimize (or otherwise reduce) shadowing within polarization chamber 100. It should be noted, however, that one or more partitions 110 alternatively (or additionally) may be included which are not aligned substantially parallel with the laser light propagation direction, so as to produce a region or cavity of shadowing or isolation within polarization chamber 100, in accordance with some embodiments. In some cases, a given partition 110 may be configured to allow alkali metal vapor to reside thereon and, thus, be at least partially isolated from the effects of laser heating. Other suitable configurations for partition(s) 110 will depend on a given target application or end-use and will be apparent in light of this disclosure.

As can be seen further from FIGS. 3-4, for example, one or more passageways 114 may be provided through polarization chamber 100. More specifically, passageway(s) 114 may be formed so as to extend through a given partition 110. In some cases, a given passageway 114 also may extend through a given wall 102 so as to be accessible from outside such wall 102 (see FIG. 3). A given passageway 114 may be configured to have one or more thermal fluids (e.g., water, an oil such as silicone oil, etc.) flowed therethrough. In this manner, passageway(s) 114 and such thermal fluid(s) may serve to assist with stabilizing the temperature of polarization chamber 100. The dimensions and quantity of passageways 114 may be customized, as desired for a given target application or end-use. Other suitable configurations for passageway(s) 114 will depend on a given target application or end-use and will be apparent in light of this disclosure.

As can be seen from FIG. 4, for example, upper end 104 of polarization chamber 100 also may include a first channel 103 and a second channel 105. Each of first channel 103 and second channel 105 generally may be configured as a substantially continuous groove or recess along at least some portion of the perimeter of polarization chamber 100. First channel 103 may be configured to host a sealing element (e.g., an O-ring) therein so as to provide polarization chamber 100 with a vacuum-tight closure. Second channel 105 may be configured to provide for substantially even distribution of inert gas(es) (e.g., as provided from inert gas source 200, discussed below) within polarization chamber 100. To that end, second channel 105 may run around the perimeter of upper end 104 and across each partition 110 in a generally serpentine (e.g., accordion-like) manner. The sides of second channel 105 may come close to but not contact laser window 120 (discussed below), allowing the lighter-weight inert gas(es) to flood upper end 104 of polarization chamber 100 after polarization is complete.

As can be seen from FIG. 2, polarization chamber 100 further may include a thermal fluid manifold 111. Thermal fluid manifold 111 may be configured to provide for flow of thermal fluid(s) (e.g., water, an oil such as silicone oil, etc.) through passageway(s) 114 of partition(s) 110 and wall(s) 102, as described above. As generally can be seen in FIG. 2, thermal fluid manifold 111 may be accessible from the exterior of polarization chamber 100 and may be covered by a plate or other suitable covering, at least in some cases.

Polarization chamber 100 also may include a baseplate 140. Baseplate 140 may be configured to reside below polarization chamber 100, providing a lower wall therefor. The body of baseplate 140 may be constructed from a non-magnetic metal or alloy, such as, for example, copper (Cu), aluminum (Al), or an alloy of any thereof, to name a few options. Baseplate 140 may include inlet(s) and/or outlet(s) for gases going to and coming from polarization chamber 100, as desired. For example, as generally can be seen from FIG. 4, baseplate 140 may include an inlet 142 through which saturated noble gas(es) (e.g., provided by saturator 350 and noble gas source 300, discussed below) may enter polarization chamber 100. As generally can be seen further from FIG. 4, baseplate 140 also may include an outlet 144 through which polarized saturated noble gas(es) may exit polarization chamber 100 to reservoir 500 (discussed below). The dimensions and positions of inlet 142 and outlet 144 may be customized, as desired for a given target application or end-use. In an example case, outlet 144 may be substantially centrally located with respect to the bounds of baseplate 140.

Baseplate 140 optionally may be provided with a gentle slope (e.g., about 5° or less from horizontal) that runs toward outlet 144. This gentle slope may serve to assist with displacement of heavier-weight polarized saturated noble gas(es) at the lower end 106 of polarization chamber 100 by lighter-weight inert gas(es) entering upper end 104 of polarization chamber 100. In an example case, baseplate 140 may be canted into quadrants, with each floor portion 146 sloping as noted toward outlet 144.

Baseplate 140 also may contain one or more heating elements (e.g., electrical heaters) near its upper surface (e.g., the surface which absorbs laser light from laser 10). For example, baseplate 140 may include a resistive heating device configured to deposit heat in or around wall(s) 102 and/or baseplate 140 in areas which would be heated by laser power deposition. Baseplate 140 also may contain one or more cooling elements (e.g., thermal fluid or water channels) near its lower surface. In this manner, a temperature difference may be provided between the upper and lower surfaces of baseplate 140, so that the direction of heat flow and the surface temperatures may be regulated more stably. Other suitable configurations for baseplate 140 will depend on a given target application or end-use and will be apparent in light of this disclosure.

Polarization chamber 100 further may include one or more glass plates 112 disposed, either directly or indirectly (e.g., having one or more intervening layers), on walls 102 and baseplate 140. A given glass plate 112 may be constructed from a glass, such as, for example, an aluminosilicate glass or a strengthened glass (e.g., such as Gorilla® Glass available from Corning Inc.), to name a few options. Generally, glass plate(s) 112 may serve as a glass cladding layer for the interior of polarization chamber 100. Moreover, as will be appreciated in light of this disclosure, glass plate(s) 112 may serve to minimize (or otherwise reduce) the nuclear relaxation rate of polarized noble gas nuclei. As will be further appreciated, aluminosilicate glass has a particularly low nuclear relaxivity and is resistant to attack by alkali metal vapors.

The dimensions and quantity of glass plate(s) 112 may be customized, as desired for a given target application or end-use. In some cases, a given glass plate 112 may have an average thickness in the range of about 0.05-0.5 mm (e.g., about 0.3 mm or less, about 0.2 mm or less, about 0.1 mm or less, about 0.1-0.3 mm, or any other sub-range in the range of about 0.05-0.5 mm). In some cases, a given glass plate 112 may be of substantially uniform thickness, whereas in some other cases, its thickness may vary in one or more regions. In some cases, a given glass plate 112 may be substantially planar in form, whereas in some other cases, one or more curvatures may be provided in one or more regions thereof. As will be appreciated in light of this disclosure, lower thicknesses for glass plate(s) 112 may offer better heat flow than greater thicknesses. Other suitable configurations for glass plate(s) 112 will depend on a given target application or end-use and will be apparent in light of this disclosure.

System 1000 further may include a laser window 120 disposed at upper end 104 of polarization chamber 100. Laser window 120 may be configured to allow laser light (e.g., circularly polarized laser light) delivered from upstream laser 10 to enter polarization chamber 100. To that end, laser window 120 may be constructed from a transparent glass, such as, for example, fused silica or quartz, to name a few options. The dimensions of laser window 120 may be customized, as desired for a given target application or end-use. In some cases, laser window 120 may have an average thickness in the range of about 4-10 mm (e.g., about 4-6 mm, about 6-8 mm, about 8-10 mm, or any other sub-range in the range of about 4-10 mm). In some cases, laser window 120 may be of substantially uniform thickness, whereas in some other cases, its thickness may vary in one or more regions. In some cases, laser window 120 may be substantially planar in form, whereas in some other cases, one or more curvatures may be provided in one or more regions thereof. As will be appreciated in light of this disclosure, it may be desirable to ensure that laser window 120 is of sufficient thickness to withstand pressure changes in the interior of the polarization volume. In some instances, laser window 120 may have a layer of aluminosilicate glass or a strengthened glass (e.g., such as Gorilla® Glass available from Corning Inc.) bonded thereto, for example, to help with resistance to alkali metal vapor attack. Other suitable configurations for laser window 120 will depend on a given target application or end-use and will be apparent in light of this disclosure.

In some embodiments, system 1000 optionally may include a mask 130 disposed upstream of laser window 120. Mask 130 may be configured to prevent (or otherwise reduce) stray laser light from laser 10 from illuminating walls 102 of polarization chamber 100. The quantity and pitch of the openings of mask 130 may be customized, as desired for a given target application or end-use. Generally, the openings of mask 130 may be configured to align substantially with the open spaces between partitions 110 and walls 102. In some cases, mask 130 may be patterned in a manner substantially matching the arrangement of partition(s) 110 within polarization chamber 100. Other suitable configurations for mask 130 will depend on a given target application or end-use and will be apparent in light of this disclosure.

Upon exiting from polarization chamber 100 via outlet 144 of baseplate 140, the polarized saturated noble gas(es) may flow along one or more pathways 147, 149, as generally can be seen from FIG. 2. For instance, the polarized saturated noble gas(es) may flow along a restricted pathway 147 (e.g., a capillary) controlled by a first valve or along a less-restricted pathway 149 (e.g., a normal-diameter tube) controlled by a second valve. Both pathways 147, 149 may lead to desaturator 400 (discussed below).

As noted above, an inert gas source 200 may be connected with upper end 104 of polarization chamber 100 (e.g., at an inlet 116 at upper end 104). Gas source 200 may be configured to supply one or more inert gases, such as, for example, nitrogen (N$_2$), argon (Ar), or Krypton (Kr), to name a few options. In some cases, gas source 200 may supply only a single inert gas, whereas in other cases, a mixture of inert gases may be supplied. In a more general sense, gas source 200 may supply inert gas(es) which are lighter than the noble gas(es) (e.g., supplied by polarizable noble gas source 300, discussed below) to be polarized by polarization chamber 100. In this manner, the lighter-weight inert gas(es) may serve to displace heavier-weight polarized saturated noble gas(es) near lower end 106 of polarization chamber 100.

Also, as noted above, a polarizable noble gas source 300 and a saturator 350 may be connected with lower end 106 of polarization chamber 100 (e.g., at an inlet 118 at lower end 106). Gas source 300 may be configured to supply one or more polarizable noble gases, such as $^{129}$Xe, $^{131}$Xe, or $^{83}$Kr, for example, to saturator 350 and downstream polarization chamber 100. In some cases, gas source 300 may supply only a single noble gas, whereas in other cases, a mixture of noble gases may be supplied. In some cases, a quenching gas, such as nitrogen, also may be supplied.

Saturator 350 may be configured to saturate the polarizable noble gas(es) received from gas source 300 with vapor of an alkali metal, such as rubidium (Rb), and to deliver the resultant saturated noble gas(es) to polarization chamber 100. To that end, saturator 350 may be (or otherwise may include) a helical or serpentine pathway through which polarizable noble gas(es) flow and are saturated with alkali metal vapor. In accordance with some embodiments, the interior of saturator 350 may include surface undulations, structures, insertions, and/or added materials which enhance the saturation of the polarizable noble gas(es) with alkali metal vapor. In some embodiments, the interior of saturator 350 may include copper gauze, fiber, or wicking material so as to enhance alkali metal vapor saturation.

In saturating the polarizable noble gas(es), saturator 350 generally may operate at a temperature that is hotter than ambient temperature. For instance, in some cases, saturator 350 may operate at a temperature in the range of about 90-120° C. (e.g., about 95-115° C., about 100-105° C., about 105-110° C., or any other sub-range in the range of about 90-120° C.). As generally can be seen in FIG. 2, for example, the flow of polarizable noble gas(es) into saturator 350 may be controlled by a valve (on the left side of the diagram), while the flow of saturated polarizable noble gas(es) into polarization chamber 100 may be controlled by another valve (on the right side of the diagram). Other suitable configurations for noble gas source 300 and saturator 350 will depend on a given target application or end-use and will be apparent in light of this disclosure.

As noted above, a desaturator 400 may be connected with polarization chamber 100 (e.g., at lower end 106 thereof). Desaturator 400 may be (or otherwise may include) a helical tube 410, the dimensions, pitch, and curvature of which may be customized, as desired for a given target application or end-use. One end of desaturator 400 may be maintained near the temperature of polarizer chamber 100, while another end thereof may be maintained at room temperature, resulting in a temperature gradient along the length of helical tube 410. In this manner, a controlled flow through helical tube 410 may be provided to reduce the concentration of alkali metal vapor in the polarized saturated noble gas(es) passing therethrough. Thus, as will be appreciated in light of this disclosure, gas(es) leaving polarization chamber 100 and entering desaturator 400 generally may be warmer than gas(es) leaving an output of desaturator 400. Other suitable configurations for desaturator 400 will depend on a given target application or end-use and will be apparent in light of this disclosure.

Additionally, a polarized noble gas reservoir 500 may be connected with desaturator 400 (e.g., at an output of helical tube 410 thereof). Reservoir 500 may be (or otherwise may include) a helical tube 510, the dimensions, pitch, and curvature of which may be customized, as desired for a given target application or end-use. Reservoir 500 may be configured to serve as an intermediate (e.g., temporary) storage in system 1000 for the polarized noble gas(es) received from desaturator 400.

Also, a gas source 550 may be connected with reservoir 500 (e.g., at an input of helical tube 510 thereof). Gas source 550 may be configured to supply a heavy inert gas, such as natural Xe, for example, to reservoir 500. In some cases, gas source 550 may supply only a single gas, whereas in other cases, a mixture of gases may be supplied. In a more general sense, gas source 550 may supply one or more inert gas(es) which are heavier than the polarized noble gas(es) resident in reservoir 500. In this manner, the heavier-weight inert gas(es) from gas source 550 may serve to push the lighter-weight polarized noble gas(es) through and out of helical tube 510 of reservoir 500 (e.g., for collection therefrom). Other suitable configurations for reservoir 500 and gas source 550 will depend on a given target application or end-use and will be apparent in light of this disclosure.

Furthermore, a storage vessel 600 may be connected with reservoir 500 (e.g., at an output thereof). Storage vessel 600 may be (or otherwise may include) a delivery bag or other suitable containment means for the polarized noble gas(es) to be collected from reservoir 500, as will be apparent in light of this disclosure.

A valve manifold 700 may be included at the junction of desaturator 400, reservoir 500, and storage vessel 600. Valve manifold 700 may be configured to provide for the polarized noble gas(es) to continue flowing to reservoir 500 while simultaneously pressuring the lower, heavier gas(es) into another volume (not shown). Valve manifold 700 also may be configured to provide for purging of storage vessel(s) 600 from air by filling with inert gas(es) and vacuuming out with a vacuum pump (not shown). Valve manifold 700 also may be configured to provide a path for filling storage vessel(s) 600 with polarized noble gas(es) from reservoir 500. Other suitable configurations for valve manifold 700 will depend on a given target application or end-use and will be apparent in light of this disclosure.

Figure 5:
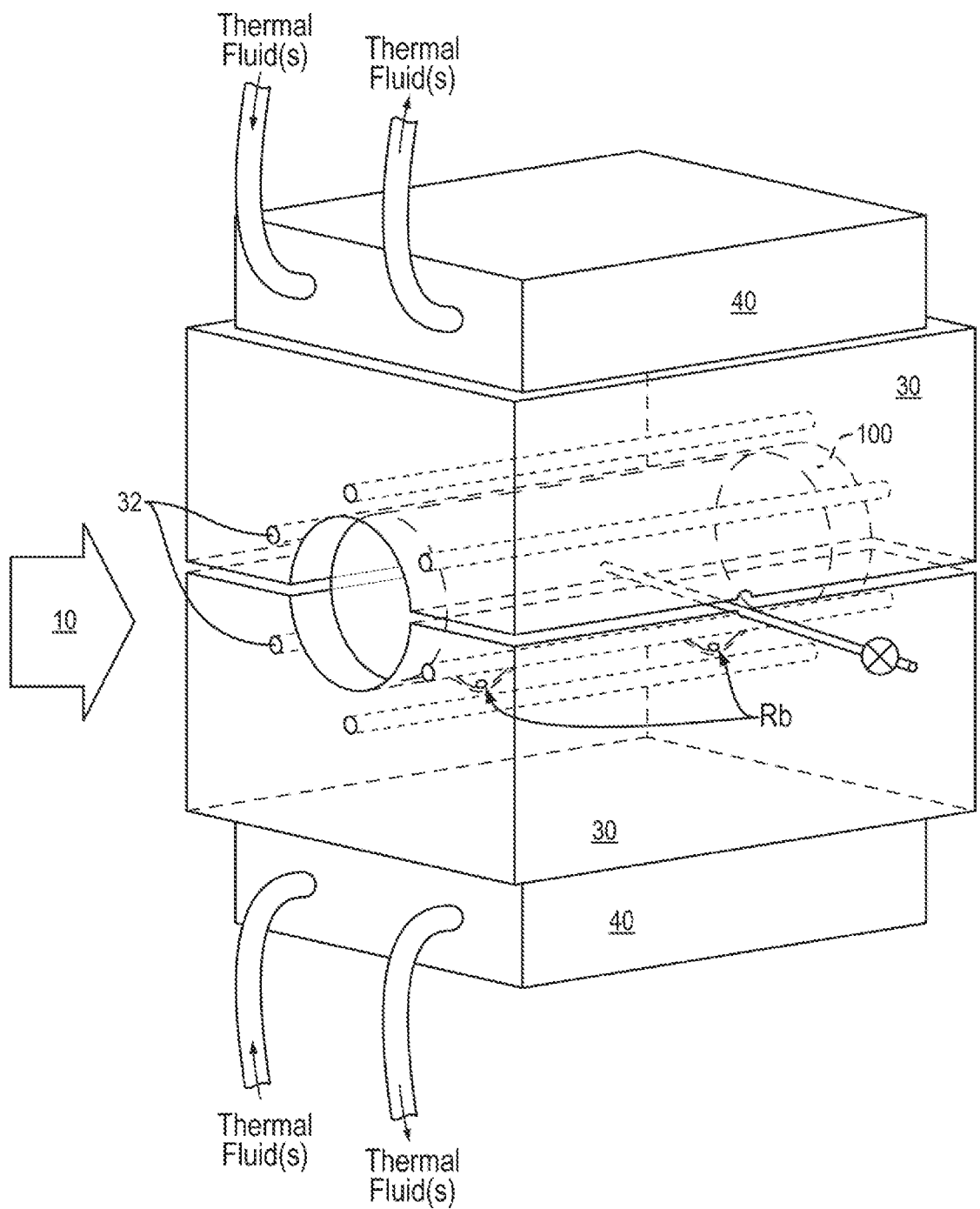
FIG. 5 is a diagram of a polarization chamber having a housing configured in accordance with an embodiment of the present disclosure.

In some embodiments, a housing 30 optionally may be included near polarization chamber 100. For instance, consider FIG. 5, which is a diagram of a polarization chamber 100 having a housing 30 configured in accordance with an embodiment of the present disclosure. As can be seen from FIG. 5, housing 30 may be configured to interface, either directly or indirectly (e.g., with one or more intervening layers) with the exterior of polarization chamber 100. Housing 30 may be, for example, a pair of generally block-like bodies configured to at least partially envelop polarization chamber 100 therebetween. More generally, housing 30 may be configured to be in thermal communication with polarization chamber 100. To that end, housing 30 may be formed, in part or in whole, from a non-magnetic, thermally conductive metal or alloy, such as, for example, copper (Cu), aluminum (Al), or an alloy of any thereof, to name a few options. Housing 30 optionally further may include inlets and/or outlets for gas(es) for polarization chamber 100. In some cases, housing 30 may include one or more heat pipes for a flowing liquid and/or vapor.

In some embodiments, housing 30 may have one or more recesses 32 (e.g., elongate holes, bores, etc.) provided therein so as to be generally proximal to the exterior surface of polarization chamber 100. Recess(es) 32 may be configured to receive a heating element therein. That is, a heating element may be received by (e.g., inserted into) a given recess 32. In this manner, a given heating element may be situated generally proximal to the exterior surface of polarization chamber 100. A given heating element may be, for example, a cartridge heater or an electric heater wire, among other options. While laser 10 is providing laser power to polarization chamber 100, heating element(s) may remain in an off state. When laser 10 ceases providing laser power to polarization chamber 100, heating element(s) may be energized so as to deposit heat substantially equivalent to the power of laser 10 to maintain the temperature of polarization chamber 100. Other suitable configurations for housing 30 will depend on a given target application or end-use and will be apparent in light of this disclosure.

In some embodiments, one or more heat exchangers 40 may be included near housing 30. For instance, as can be seen from FIG. 5, a given heat exchanger 40 may be configured to interface, either directly or indirectly (e.g., with one or more intervening layers) with housing 30. In an example case, a first heat exchanger 40 may be interfaced with the exterior of a first portion of housing 30, while a second heat exchanger 40 may be interfaced with the exterior of a second portion of housing 30. One or more thermal fluids may be flowed through a given heat exchanger 40. As will be appreciated in light of this disclosure, the temperature difference between polarization chamber 100 and heat exchangers 40 may be substantially stable because the heat flow thereat is constant. Other suitable configurations for heat exchanger(s) 40 will depend on a given target application or end-use and will be apparent in light of this disclosure.

In accordance with some embodiments, at least a portion of polarization chamber 100 may be configured to be at least partially immersed in a liquid having a temperature that is lower than that of a laser-illuminated gas disposed within polarization chamber 100 during operation thereof in effectuating polarization. Some example suitable liquids may include flowing water and a flowing oil, to name a few.

Methodologies

In accordance with some embodiments, a method of polarizing a noble gas, as variously described herein, may be performed beginning with an evacuated system 1000, filling saturator 350 with a desired quantity of $^{129}$Xe mix (e.g., from noble gas source 300), and allowing the $^{129}$Xe mix to become saturated with alkali metal vapor. Reservoir 500 may be filled with natural Xe (e.g., from gas source 550) to a pressure of 1 atmosphere. Then, the natural Xe may be allowed to expand to fill desaturator 400 as well, causing the pressure to drop. When the $^{129}$Xe mix is fully saturated with alkali metal vapor in saturator 350, a valve to polarization chamber 100 may be opened, allowing the saturated $^{129}$Xe mix to enter polarization chamber 100. In the process, additional $^{129}$Xe mix (e.g., from noble gas source 300) may be allowed to enter and pressurize saturator 350, pushing the remainder of the already saturated $^{129}$Xe mix through a circuitous path into polarization chamber 100. Then, valves may be closed and laser 10 may be energized to polarize the saturated $^{129}$Xe mix inside polarization chamber 100. After sufficient polarization, valves may be opened on each end (e.g., upper and lower ends 104, 106) of polarization chamber 100, allowing a lighter inert gas (e.g., from gas source 200) to flood one end (e.g., upper end 104) of polarization chamber 100 and push the polarized saturated $^{129}$Xe mix out from another end (e.g., lower end 106) of polarization chamber 100. Then, the polarized saturated $^{129}$Xe mix may be allowed to pass through desaturator 400, being exposed to the temperature gradient thereof. The resultant polarized $^{129}$Xe mix may be allowed to pass into reservoir 500, and this transfer may compress the natural Xe previously occupying reservoir 500. When equilibrium is reached, a valve between desaturator 400 and reservoir 500 may be closed and a valve from reservoir 500 to a storage vessel 600 (e.g., a delivery bag) may be opened. The compressed natural Xe in reservoir 500 then may be allowed to push the polarized $^{129}$Xe mix into storage vessel 600. Upon completion of this transfer, valves may be closed and desaturator 400 and polarization chamber 100 may be pumped down to a vacuum. The process then may be repeated.

In accordance with some embodiments, a method of polarizing a noble gas, as variously described herein, may be performed beginning either after (A) filling of a storage vessel 600 and subsequently evacuating desaturator 400 and polarization chamber 100 or (B) in a starting state where (1) saturator 350 has a desired amount of gas mix for polarizing that has reached an optimal temperature and alkali vapor concentration, (2) an inert gas source 200 is filled with lighter-weight inert gas(es) to a desired elevated pressure, and (3) an output volume and reservoir 500 are filled with a heavier gas at a pressure close to atmospheric pressure. From this latter example starting state, storage vessel 600 (e.g., one or more delivery bags) may be attached, purged, and evacuated. Next, alkali metal vapor-saturated noble gas mix may be permitted to flow from saturator 350 to polarization chamber 100. Additional unsaturated noble gas mix may enter saturator 350, displacing the saturated noble gas mix through a serpentine path thereof. Separately, a heavier-weight noble gas may be allowed to expand into the evacuated desaturator 400, reaching equilibrium. When polarization is complete, valves may be opened such that polarized noble gas mix flows slowly from polarization chamber 100, slowly displacing the heavier-weight noble gas in desaturator 400. During this process, lighter-weight gas also may be displacing the polarized noble gas mix from above. The method continues until lighter-weight gas may fill polarization chamber 100 and desaturator 400, and the polarized noble gas mix has completed its transit of desaturator 400 and occupies the intermediate reservoir 500. Valves then may be activated to close the path between reservoir 500 and desaturator 400 and other valves may be opened to allow the polarized noble gas mix to fill the evacuated and purged storage vessel(s) 600. The heavier noble gas may expand from the lower reservoir 500 until an equilibrium pressure is reached, bringing the lower volume, reservoir 500, and storage vessel 600 all to near 1 atmosphere, and approximately all the polarized noble gas mix may be displaced by the heavier noble gas into storage vessel 600. Valves then may be closed, polarization chamber 100 and desaturator 400 may be evacuated, storage vessel(s) 600 may be replaced, and the process may be repeated.

In accordance with some embodiments, a polarizing method is provided, wherein a bolus of the gas mixture containing the heavy noble gas species and saturated with the alkali metal vapor becomes polarized in polarization chamber 100, and is then transferred through desaturator 400 over a duration, thereby becoming approximately fully desaturated of the alkali metal vapor. In some cases, the transfer may involve opening a valve located between the two volumes. In some cases, the transfer may involve introducing additional gas mixture, thereby displacing the gas currently residing in polarization chamber 100, causing it to move into desaturator 400. In some cases, the transfer may involve introducing into polarization chamber 100 a lighter-weight gas at or near upper end 104 thereof, thereby displacing the gas currently residing in polarization chamber 100, causing it to move out a port at or near lower end 106 thereof and pass into desaturator 350. In some cases, the transfer involves removing gas from desaturator 350, thereby drawing in gas mixture from polarization chamber 100 into desaturator 350. A subsequent transfer may be accomplished between at least a portion of desaturator 350 (at a cooler temperature and functioning as an intermediate storage region) and at least one bolus bag by opening a valve, causing the gas currently residing in at least a portion of desaturator 350 to move into the at least one bolus bag. In some cases, the subsequent transfer may be accomplished between at least a portion of desaturator 350 (functioning as an intermediate storage region) and at least one bolus bag by introducing additional gas, thereby effecting displacement of the gas currently residing in at least a portion of desaturator 350, causing that gas to move into the at least one bolus bag.

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description. Future-filed applications claiming priority to this application may claim the disclosed subject matter in a different manner and generally may include any set of one or more limitations as variously disclosed or otherwise demonstrated herein.

What is claimed is:

1. An apparatus configured for polarizing a noble gas, the apparatus comprising:
   a body portion having a hollow interior region;
   a laser window disposed at a first end of the body portion and configured to allow laser light to enter the hollow interior region;
   a baseplate disposed at a second end of the body portion, opposite the laser window, wherein the baseplate serves as a wall terminating an extent of the hollow interior region;
   at least one partition that extends into the hollow interior region and which is aligned substantially parallel with a propagation direction of the laser light; and
   a cladding layer disposed over at least a portion of the baseplate, wherein the cladding layer is configured to facilitate reduction of a nuclear relaxation rate of polarized noble gas nuclei;
   wherein in operation of the apparatus, the laser light is incident with and terminates at the baseplate.

2. The apparatus of claim 1, wherein the at least one partition comprises a plurality of partitions arranged adjacent one another and extending along one transverse direction within the hollow interior region.

3. The apparatus of claim 1, further comprising at least one interior region that is at least partially obstructed from illumination by the laser light.

4. The apparatus of claim 1, wherein the at least one partition has at least one passageway defined therein which is configured to have a thermal fluid flowed therethrough.

5. The apparatus of claim 1, wherein the cladding layer comprises a glass layer.

6. The apparatus of claim 1, wherein the baseplate has at least one sloped surface having a slope within 5° of horizontal and configured to have the laser light incident therewith.

7. The apparatus of claim 6, wherein the at least one sloped surface comprises a plurality of sloped surfaces having corresponding slopes which converge to an outlet from the apparatus.

8. The apparatus of claim 1, further comprising a housing at least partially enclosing the body portion.

9. The apparatus of claim 8, wherein:
   the housing is comprised of at least one of a thermally conductive metal and a thermally conductive alloy; and
   at least a portion of the housing is in direct physical contact with an exterior surface of the body portion.

10. The apparatus of claim 8, wherein the housing has at least one recess defined therein which is configured to receive a heater element therein, wherein the at least one recess is situated proximal an external surface of the body portion.

11. The apparatus of claim 8, wherein the housing comprises:
    a first housing portion disposed adjacent a first exterior region of the body portion; and
    a second housing portion disposed adjacent a second exterior region of the body portion;
    wherein the first housing portion and the second housing portion are physically distinct and separate from one another.

12. The apparatus of claim 11, further comprising:
    a first heat exchanger disposed adjacent the first housing portion, wherein at least a portion of the first heat exchanger is in direct physical contact with an exterior surface of the first housing portion; and
    a second heat exchanger disposed adjacent the second housing portion, wherein at least a portion of the second heat exchanger is in direct physical contact with an exterior surface of the second housing portion;
    wherein the first heat exchanger and the second heat exchanger are physically distinct and separate from one another.

13. The apparatus of claim 8, further comprising at least one heat exchanger disposed adjacent the housing, wherein at least a portion of the at least one heat exchanger is in direct physical contact with an exterior surface of the housing.

14. A system comprising:
    the apparatus of claim 1; and
    at least one of the following in flow communication with the apparatus:
      at least one source of a polarizable noble gas;
      at least one source of an alkali metal vapor for saturating the polarizable noble gas;
      at least one saturator for saturating the polarizable noble gas with the alkali metal vapor;
      at least one source of an inert gas that is lighter than the polarizable noble gas;
      at least one desaturator for desaturating the polarizable noble gas of the alkali metal vapor;
      at least one reservoir for temporarily storing a polarized noble gas produced by the apparatus; and
      at least one source of an inert gas that is heavier than the polarizable noble gas.

15. The apparatus of claim 1, wherein the baseplate abuts an exterior surface of the body portion.

16. The apparatus of claim 1, wherein at least a portion of the baseplate directly physically contacts the second end of the body portion.

17. The apparatus of claim 1, wherein the baseplate is configured to absorb at least a substantial portion of the laser light incident therewith.

18. The apparatus of claim 1, wherein the baseplate has formed therein at least one of:
- an inlet through which the noble gas enters the apparatus; and
- an outlet through which polarized noble gas exits the apparatus.

19. The apparatus of claim 1, wherein in operation of the apparatus, the laser light passes through the cladding layer to be incident with the baseplate.

20. The apparatus of claim 1, wherein the cladding layer also is disposed over at least a portion of the at least one partition.

* * * * *